(12) United States Patent
Bufe

(10) Patent No.: US 8,098,139 B2
(45) Date of Patent: Jan. 17, 2012

(54) TEST HEAD DEVICE

(75) Inventor: Henrik Bufe, Leipzig (DE)

(73) Assignee: Muehlbauer AG, Roding (DE)

(*) Notice: Subject to any disclaimer, the term of this patent is extended or adjusted under 35 U.S.C. 154(b) by 883 days.

(21) Appl. No.: 12/090,029

(22) PCT Filed: Oct. 12, 2006

(86) PCT No.: PCT/EP2006/067328
§ 371 (c)(1),
(2), (4) Date: May 20, 2008

(87) PCT Pub. No.: WO2007/042551
PCT Pub. Date: Apr. 19, 2007

(65) Prior Publication Data
US 2008/0246591 A1   Oct. 9, 2008

(30) Foreign Application Priority Data

Oct. 12, 2005  (DE) .......................... 10 2005 048 872

(51) Int. Cl.
*H04Q 5/22* (2006.01)

(52) U.S. Cl. .................. 340/10.51; 340/10.1; 340/10.2; 340/10.3; 340/10.31; 340/10.32; 340/572.5; 340/572.6; 340/572.7; 340/572.8; 340/572.9; 340/10.33; 340/10.34; 340/10.4; 340/10.41; 340/10.42; 340/10.5; 340/10.52; 340/10.6; 700/1; 714/57

(58) Field of Classification Search .............. 340/10.51, 340/572.1–572.9, 572.81, 10.1–10.6; 700/1; 714/57; 235/375–385
See application file for complete search history.

(56) References Cited

U.S. PATENT DOCUMENTS

| | | | | |
|---|---|---|---|---|
| 5,568,155 A * | 10/1996 | Tsunekawa et al. | ... | 343/700 MS |
| 5,945,835 A * | 8/1999 | McDonough et al. | ... | 324/750.25 |
| 6,369,593 B1 * | 4/2002 | Ott | ........... | 324/750.17 |
| 6,574,764 B2 * | 6/2003 | Krech et al. | ................ | 714/738 |
| 6,586,924 B1 * | 7/2003 | Okayasu et al. | ......... | 324/750.02 |
| 6,671,844 B1 * | 12/2003 | Krech et al. | ................. | 714/736 |
| 6,687,861 B1 * | 2/2004 | Jordan et al. | ................. | 714/718 |
| 6,724,730 B1 * | 4/2004 | Mlinarsky et al. | ............ | 370/241 |
| 6,834,364 B2 * | 12/2004 | Krech et al. | ................... | 714/45 |
| 6,838,746 B2 * | 1/2005 | Brenner | ........ | 257/510 |
| 7,191,368 B1 * | 3/2007 | Organ et al. | ................... | 714/57 |
| 7,196,508 B2 * | 3/2007 | Ham et al. | ............... | 324/757.04 |
| 7,206,549 B2 * | 4/2007 | Lin et al. | ................... | 455/67.11 |

(Continued)

*Primary Examiner* — George Bugg
*Assistant Examiner* — Paul Obiniyi
(74) *Attorney, Agent, or Firm* — John A. Miller; Miller IP Group, PLC

(57) ABSTRACT

There is disclosed a test head device for testing the functionality of a large number of RFID chips arranged in smart labels (17) within a smart label production apparatus by means of a data reading and/or data writing process, wherein the smart labels (17), each comprising a first antenna (10a-10e), are placed next to and behind one another on a common continuously moving strip, wherein the test head device comprises a plurality of test systems which function independently of one another, each of said test systems consisting of a write and/or read unit (12a-e), a second antenna (3, 11a-e; 18) connected thereto which is in each case assigned to one of the first antennas (10a-10e) for simultaneously transmitting read and/or write data between the first and second antennas (10a-10e; 3; 11a-e; 18) by means of ultrahigh frequency waves, and a common table unit which can be displaced at least in the height direction, wherein the second antennas (3; 11a-e; 18) are arranged on a common antenna carrier plate (2) oriented parallel to the strip.

12 Claims, 3 Drawing Sheets

U.S. PATENT DOCUMENTS

| | | | |
|---|---|---|---|
| 7,215,295 B2 * | 5/2007 | Egbert | 343/795 |
| 7,242,996 B2 * | 7/2007 | Roesner | 700/117 |
| 7,262,590 B2 * | 8/2007 | Nakajima | 324/750.25 |
| 7,262,740 B2 * | 8/2007 | Tikhov et al. | 343/770 |
| 7,275,197 B2 * | 9/2007 | Inaba et al. | 714/740 |
| 7,477,152 B2 * | 1/2009 | Forster | 340/572.8 |
| 7,594,571 B2 * | 9/2009 | Lin | 198/339.1 |
| 7,874,727 B2 * | 1/2011 | Forster et al. | 378/196 |
| 2002/0026258 A1 * | 2/2002 | Suzuki et al. | 700/112 |
| 2004/0215350 A1 * | 10/2004 | Roesner | 700/1 |
| 2005/0053008 A1 * | 3/2005 | Griesing et al. | 370/241 |
| 2005/0102580 A1 * | 5/2005 | House et al. | 714/38 |
| 2005/0110698 A1 * | 5/2005 | Surducan et al. | 343/795 |
| 2005/0114550 A1 * | 5/2005 | Kushnick | 709/248 |
| 2005/0116873 A1 * | 6/2005 | Castany et al. | 343/795 |
| 2005/0171718 A1 * | 8/2005 | Ito | 702/117 |
| 2005/0212544 A1 * | 9/2005 | Nakajima | 324/763 |
| 2005/0240852 A1 * | 10/2005 | Inaba et al. | 714/740 |
| 2005/0246390 A1 * | 11/2005 | House et al. | 707/200 |
| 2006/0038579 A1 * | 2/2006 | Guthrie et al. | 324/765 |
| 2006/0038724 A1 * | 2/2006 | Tikhov et al. | 343/700 MS |
| 2006/0044192 A1 * | 3/2006 | Egbert | 343/700 MS |
| 2006/0103536 A1 * | 5/2006 | Kwak et al. | 340/572.7 |
| 2006/0214655 A1 * | 9/2006 | Ham et al. | 324/158.1 |
| 2006/0220859 A1 * | 10/2006 | Nagai et al. | 340/572.1 |
| 2006/0229018 A1 * | 10/2006 | Mlinarsky et al. | 455/67.11 |
| 2006/0229020 A1 * | 10/2006 | Mlinarsky et al. | 455/67.14 |
| 2006/0233111 A1 * | 10/2006 | Wright | 370/241 |
| 2007/0057795 A1 * | 3/2007 | Kawai et al. | 340/572.7 |
| 2007/0080700 A1 * | 4/2007 | Kolman | 324/765 |
| 2007/0080752 A1 * | 4/2007 | Smith | 331/16 |
| 2007/0096882 A1 * | 5/2007 | Bandy et al. | 340/10.51 |

\* cited by examiner

TEST HEAD DEVICE

The invention relates to a test head device for testing the functionality of a large number of RFID chips arranged in smart labels within a smart label production apparatus by means of a data reading and/or data writing process, wherein the smart labels, each comprising a first antenna, are placed next to and behind one another on a common continuously moving strip, according to the preamble of claim 1.

Smart labels usually consist of an antenna and an RFID (radiofrequency identification) chip connected thereto, and are arranged both behind one another and next to one another at a small distance from one another on a common web which is a continuously moving strip consisting of a plastic film, a paper or the like. Such narrow webs as continuously moving strips are characterised by the fact that, due to a necessary high throughput of the smart label production apparatus within which the strip runs, they comprise a very close arrangement of a large number of smart labels. Usually several thousand smart labels per hour are continuously produced in such smart label production apparatuses.

In order to carry out an initialisation of such RFID chips which are arranged in the smart labels, together with a writing and reading of the RFID chips with an individual ID number and also further data, it is necessary to write to and read from a selected smart label independently of the adjacent smart label without influencing the latter in order to unambiguously assign the ID (identification) number to a given smart label. This usually takes place by means of high frequency wave transmission from an antenna arranged in the device to the antenna of the smart card.

Furthermore, in order to carry out a functional test of the smart label in association with and/or after the reading and writing process, a targeted selection of a specific smart label without any influencing by adjacent smart labels is required. This requires the individual actuation of individual smart labels by means of the antenna which transmits write and/or read data and an associated write and/or read element, as a result of which, due to the long initialisation times of several seconds per smart label for each programming operation, the throughput of the entire production apparatus is reduced since more smart labels are produced than can subsequently be initialised and tested.

Due to smart labels designs that are used in different ways and due to differently constructed UHF RFID chips, it is necessary to use different types of test antennas at different distances from one another and to avoid a common functional test procedure and read and write process control.

Accordingly, the object of the present invention is to provide a test head device for testing the functionality of a large number of RFID chips arranged in smart labels within a smart label production apparatus by means of a data reading and/or data writing process, which test head device makes it possible to check and test a large number of RFID chips while retaining a high throughput of the production apparatus, wherein influencing by adjacent write and read processes is to be avoided and rapid adaptation of the test head device to differently constructed RFID chips is possible.

This object is achieved by the features of claim 1.

One essential aspect of the invention is that, in a test head device for testing the functionality of a large number of RFID chips arranged in smart labels within a smart label production apparatus by means of a data reading and/or data writing process, wherein the smart labels, each comprising a first antenna, are placed next to and behind one another on a common continuously moving strip, said test head device comprises a plurality of test systems which function independently of one another. Each of the test systems consists of a write and/or read unit, a second antenna as a test antenna connected thereto which is in each case assigned to one of the first antennas for simultaneously transmitting read and/or write data between the first and second antennas by means of ultrahigh frequency waves, and a common table unit which can be displaced at least in the height direction. The second antennas are arranged on a common antenna carrier plate oriented parallel to the strip. Due to the separate arrangement of test systems which function independently of one another in the electrical, electromagnetic and mechanical sense, ultrahigh frequency waves can be transmitted and received with different frequency values, different polarisation directions and optionally laterally spaced-apart read and write data transmissions, in order thus to allow a reliably separate, high-frequency-decoupled actuation of individual smart labels independently of the read and write processes of the adjacent smart labels. As a result, mutual influencing of adjacent RFID chips during their simultaneous functional check is avoided.

Usually, 2 to 10 UHF smart labels which have to be tested or written to or read simultaneously within a very short time are arranged on a strip, also known as a narrow web. By using a test head which comprises the antenna carrier plate with the second antennas, spacers arranged thereon for keeping the strip at a distance from the antenna carrier plate, a holding plate arranged parallel to the antenna carrier plate, HF connection elements for connecting the read and/or write units, and a common coding connection for transmitting coding data with initial values for parameters relating to the read and write processes of the second antennas, a test unit on the adjustable or displaceable table can quickly be exchanged in order to be able to test different smart label designs with differently arranged RFID chips and differently constructed UHF RFID chips by adapting the test head. It should be noted here that a write process to RFID chips takes much more time than a read process from said RFID chip.

For a test procedure as described above, the strip is moved discontinuously, i.e. it is briefly stopped in order to carry out the test procedure by moving the test head or test device towards the strip from above or below by means of the displaceable table. Here, the number of test systems used which are contained in the test head device can be divided by the number of smart labels produced per machine cycle. As a result, one or more test positions are created to which the test head device has to be moved in order to be able to test all the smart labels produced in the machine cycle targeted on the production apparatus. The number of possible test positions depends on the cycle time of the production apparatus and on the time taken by a test cycle, including the positioning of the test head. Here, the total time required by the test system as a whole in order to work through all the positions must not be greater than the cycle time of the machines of the production apparatus. If this is the case, the number of test systems operating in parallel within the test head device must be increased.

The different test systems arranged in the test head device are connected to a common control device which exchanges various control and regulation data with each test system independently of one another in order to control the individual read and/or write processes.

In order to avoid any influencing of the test processes by adjacent test processes, the second antennas may have different shapes.

In order to improve the transmission rate, preferably an HF attenuation element is in each case arranged between the read and/or write units and their associated second antennas.

The coding data transmitted by means of the coding connection are transmitted to the connected read and write units and the displaceable table unit and include values for operating frequencies, chip types and the power of the UHF waves. Positioning values for the table unit for displacing the latter in the X and Y direction, i.e. parallel to the course of the strip plane, and in the Z direction, i.e. towards or away from the strip plane, may also be transmitted.

The table unit can be moved in the length and width direction of the strip by means of sliding movements in order to obtain a suitable assignment of the second antennas to the first antennas and the RFID chips.

The second antennas may preferably be double inverted F antennas.

Further advantageous embodiments emerge from the dependent claims.

Advantages and expedient features can be found in the following description in conjunction with the drawing, in which.

Figure 1:
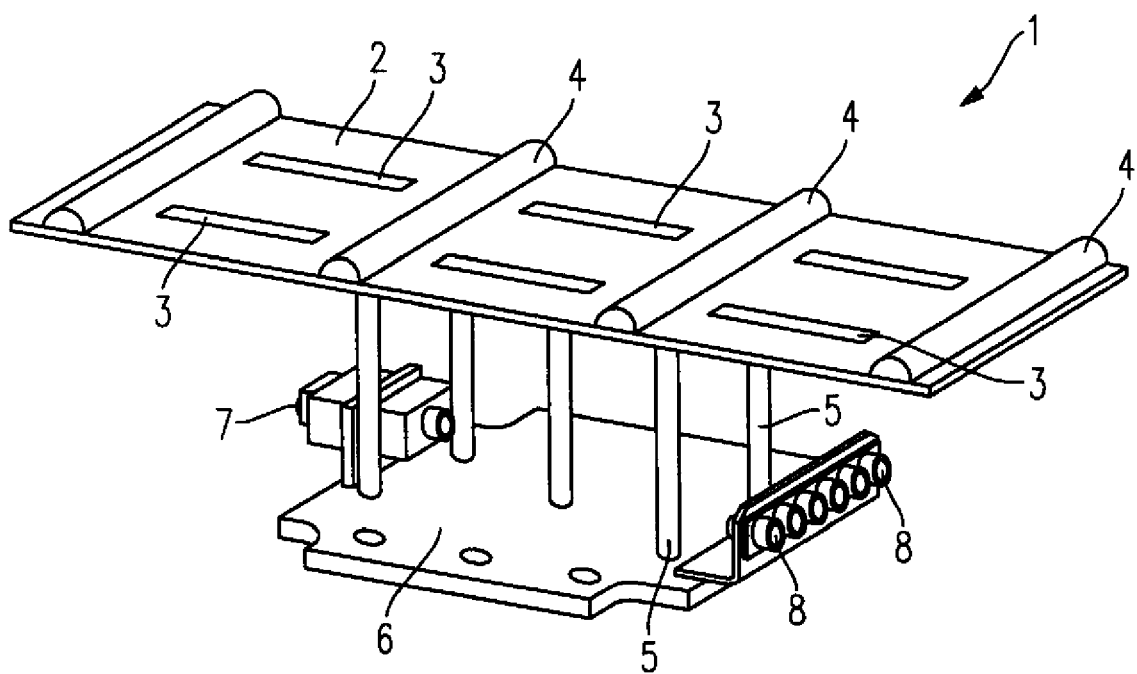
FIG. 1 shows, in a schematic perspective view, a test head for a test head device according to one embodiment of the invention.

FIG. 1 shows, in a perspective view, a test head for a test head device according to one embodiment of the invention. The test head is arranged in an exchangeable manner on a table (not shown in detail here) which can be displaced in all three dimensions. As a result, it can be adapted to all modifications resulting in the test area from a product change with regard to the smart labels and the RFID chips within a production apparatus.

The test head 1 comprises an antenna carrier plate 2 with second antennas 3 arranged thereon, wherein the antenna carrier plate 2 is kept at a distance by means of spacers 4 from a strip (not shown in detail here) on which there are arranged the smart labels comprising the associated RFID chips to be tested.

Connecting struts 5 connect the antenna carrier plate 2 to a holding plate 6 which is designed to be arranged on the table and to allow the rapid exchange of the test head as a whole.

A coding connection 7 for the transmission of coding data from a central or decentralised control device to the test head regarding the software parameter setup assigned to the test head is arranged below the antenna carrier plate 2.

HF connection elements for connecting the read and/or write units (readers) represent a number of defined interfaces which establish a high frequency connection and guarantee test systems which function independently of one another.

The antenna carrier plate 2 usually has 2 to 10 test antennas 3 integrated thereon. The spacers 4 define the distance of an intermediate space between the antenna carrier plate and the strip, which is necessary to ensure a targeted and good transmission of the ultrahigh frequency waves.

The test head contains full know-how in the form of the arrangement and design of the test antennas and allows the allocation of a test system to an individual smart label or to the RFID chip contained therein. Such an unambiguous allocation is absolutely necessary in order to obtain reliable information about the functionality of the individual RFID chips. Such a test head, together with the test systems, forms a system that is closed per se.

All the mechanical changes to the smart label arrangements on the strip or web are matched on the antenna carrier plate 2 by a corresponding arrangement of the second antennas or test antennas. Here, the spacings, orientations and sizes of the smart labels may vary.

The test head is installed on the table arranged in the test area for positioning below the web. The table is then displaced with regard to its height in order to move the test head towards the web and to obtain an alignment, in the X and Y direction, of the second antennas or test antennas relative to the first antennas on the smart labels.

Figure 2:
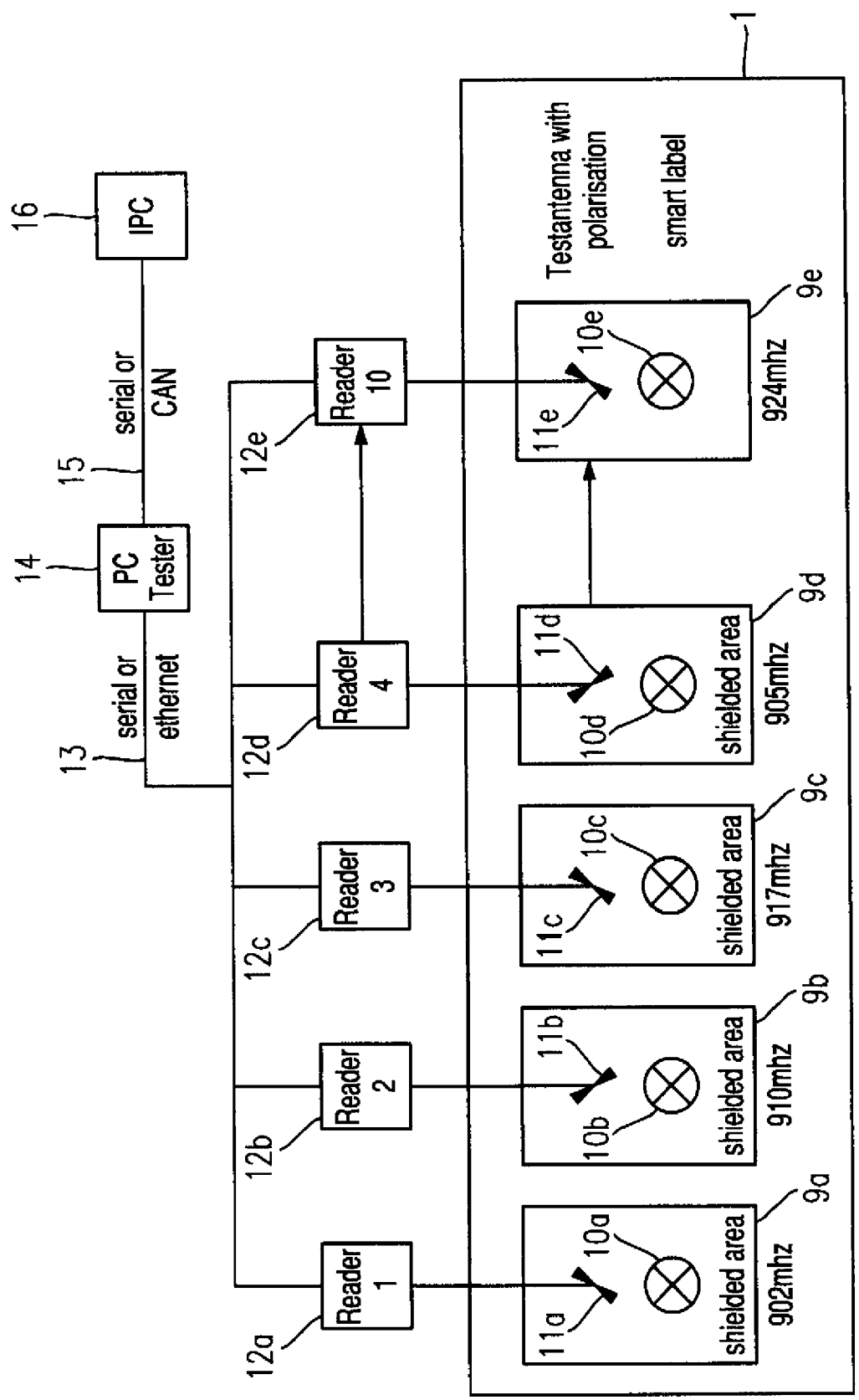
FIG. 2 shows, in a schematic plan view, the basic structure of the test head device according to the embodiment of the invention.

FIG. 2 shows, in a schematic plan view, the basic structure of the test head device according to the embodiment of the invention. The test head 1 comprises a plurality of shielded areas 9a-9e corresponding to the number of smart labels of similar shape which are arranged therebelow on a strip (not shown in detail). The delimited or shielded areas are obtained by using different frequencies, for example 902, 910, 917, 905 or 925 MHz, or different polarisation forms of the ultrahigh frequency waves to be transmitted.

The second antennas 11a-11e transmitting the ultrahigh frequency waves are shown in such a way that the polarisation direction of the ultrahigh frequency waves transmitted by these antennas differs at least from the directly adjacent shielded area 9a-9e.

Each antenna 11a, 11e is individually connected to a read and write unit 12a-12e, which initiate and control the read and write processes for carrying out the test procedures.

All the read and write units 12a-12e are connected via a serial or Ethernet connecting line 13 to a PC tester program 14 and also via a serial or CAN line 15 to an IPC 16 as the central control unit. For a test procedure to be carried out on a plurality of smart labels and RFID chips contained therein, the web is moved discontinuously in order to move the test head towards the web while the web is at a standstill and thus to be able to carry out the test procedure.

A transmission of the ultrahigh frequency waves with different frequencies and different polarisations then takes place from the second to the first antennas and vice versa. In order to be able to obtain a suitable and sufficient isolation of the individual test procedures from the test procedures of the adjacent antennas, in addition to using different high frequency waves and different polarisations a small bandwidth is also used for each test antenna, which ensures optimal transmission between the smart labels and the read and write units (RFID readers) only on the assigned operating frequency. Each test antenna, with regard to its resonant frequency and impedance, is specially optimised to the operating frequency of the associated RFID reader.

The test antennas are advantageously arranged or integrated as microstrip antennas on a common or separate circuit board with a common or separate ground plane. Here, the emission characteristic of each individual test antenna is at a 90° angle to the antenna carrier plate.

All the second antennas with the associated test systems are actuated and operated at the same time independently of one another. As a result, only the smart label directly associated with the respective test antenna can be written to and read.

Mutual influencing of the different test systems can advantageously be improved by a targeted reduction of the imitated HF power of the UHF waves to the lowest value required for the application.

In order to improve the transmission properties, attenuation elements may moreover be inserted between the RFID readers and the respective test antennas. Each RFID reader has it own constantly available communication interface to the central control unit.

Figure 3:
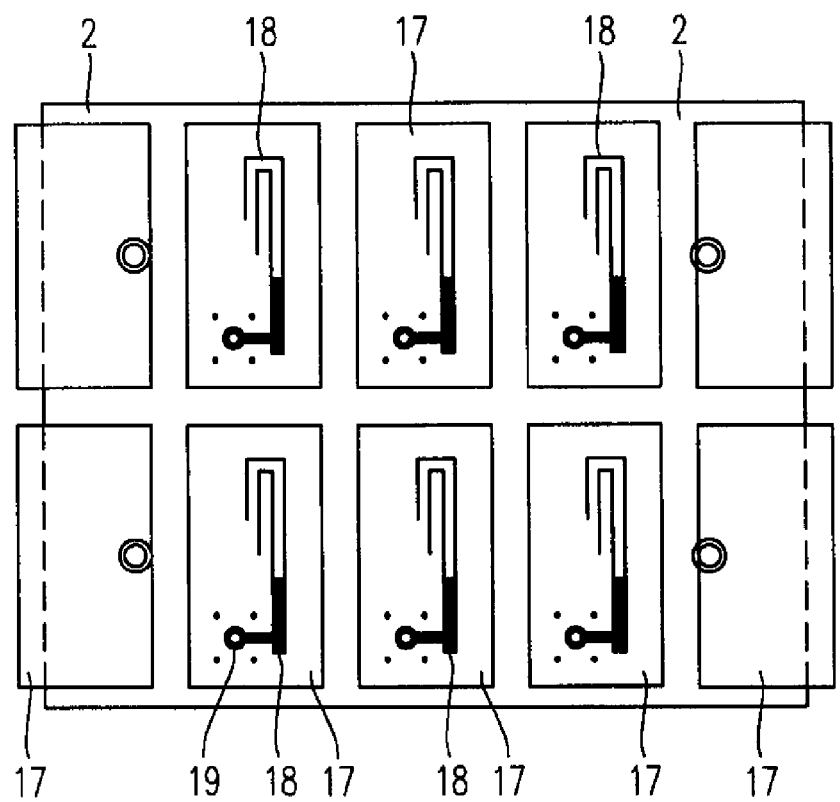
FIG. 3 shows, in a schematic plan view, the test head of the test head device according to one embodiment of the invention with smart labels located therebelow.

FIG. 3 shows, in a schematic plan view, the test head with smart labels arranged therebelow according to one embodiment of the test head device according to the invention. Arranged on a common antenna carrier plate 2, which is arranged above smart labels 17 shown schematically here, are individual test antennas 18 with connection points 19 for SMA coaxial connectors corresponding to the distribution of the smart labels 17. The antenna carrier plate 2 has a ground plane on its rear side for the purpose of shielding from the adjacent smart label test procedures.

All the test antennas are optimised to a real impedance of 50 Ohm. Such test antennas are formed in a microstrip method with a ground reference plane on one side. The antennas are designed as near-field antennas, meaning that no optimisation of the radiation resistance and of the antenna gain takes place under far-field conditions. A radiation efficiency of the test antennas is deliberately kept low so as to be able to obtain the good isolation values relative to adjacent test antennas.

Between two adjacent test antennas, there is transfer attenuation as isolation of at least 35 dB, based on the respective operating frequency of a test antenna. The test antennas are in each case individually connected to the RFID readers via SMA connections on the test head. The coupling of a coaxial cable to the test antenna in order to connect the HF connection points to the integrated test antennas may take place via an SMA connector or a directly soldered coaxial cable.

Using the test head shown in FIG. 3, 6 smart labels can be tested simultaneously with an extreme packing density of the smart labels on the web. During the test procedure, a complete initialisation of the RFID chips takes place, with a subsequent read operation for checking purposes. Here, each of the 6 test antennas 18 is responsible for one smart label 17.

For a coding of the test head, the coding connection contains a digital, binary coding of the test head number. By means of this coding, it is possible to store a parameter setup for the test head and the table, which adjusts the connected RFID readers 12a-12e in terms of the operating frequency, the chip type and their power. Furthermore, the number and precise position data of the test positions of the table can be stored via this coding. These parameters are then transmitted automatically to the test components of the test head device after a test head change has taken place. By using software to avoid positioning the table in areas which result as a function of the dimensions of the test head, such automatic transmission of the parameters when changing the test head becomes clear.

Figure 4:
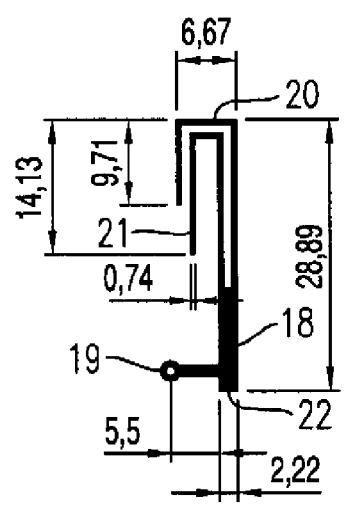
FIG. 4 shows, in a plan view, the shape of a test antenna for the test head device according to the embodiment of the invention.

FIG. 4 shows, in a plan view, a special antenna shape of a test antenna for a test head device according to one embodiment of the invention. The test antenna is a base-matched double inverted F antenna. Such an F antenna 18 is formed or produced by means of a microstrip technique with a continuous ground reference plane on the rear side of the circuit board.

The F antenna has a first and a second monopole 20, 21 and also a feeding point 19 and a base point 22 with a 13 pF capacitor opposite the ground plane.

All the features disclosed in the application documents are claimed as essential to the invention in so far as they are novel individually or in combination with respect to the prior art.

LIST OF REFERENCES 1 test head
2 antenna carrier plate
3 second antennas
4 spacers
5 connecting struts
6 holding plate
7 coding connection
8 HF connection element
9a-9e shielded test areas
10a-10e first antennas
11a-11e second antennas
12a-12e RFID readers
13 serial or Ethernet connection
14 PC tester
15 serial or CAN connection
16 IPC
17 smart labels
18 second antennas
19 connection point for SMA coaxial connector
20 first monopole of the second antenna
21 second monopole of the second antenna
22 base point of the second antenna

The invention claimed is:

1. A test head device for testing the functionality of a large number of RFID chips arranged in smart labels within a smart label production apparatus, the smart labels having a first antenna are placed next to and behind one another on a common continuously moving strip, the test head device comprising:
a plurality of test systems which function independently of one another, each of said test systems comprising one of a write or read unit, a second antenna connected thereto which is assigned to one of the first antennas for simultaneously transmitting one of read or write data between the antennas using ultrahigh frequency (UHF) waves,
wherein the second antennas are arranged on a common antenna carrier plate oriented parallel to the strip and wherein the UHF waves are transmitted with one of a different polarization or a different frequency than adjacent second antenna.

2. The test head device according to claim 1, further comprising a common control device connected to the test systems for exchanging various control and regulation data with each test system independently of one another in order to control read and write processes.

3. The test head device according to claim 1, wherein each test system contains a common table unit which is displaceable at least in the height direction.

4. The test head device according to claim 1, wherein each second antenna is shaped different from that of the adjacent second antenna.

5. The test head device of claim 4, wherein at least one test system includes an HF attenuation element arranged between the read or write units and their associated second antenna.

6. The test head device according to claim 3, further comprising a test head comprising an antenna carrier plate with the second antennas, spacers arranged thereon for keeping the strip at a distance from the antenna carrier plate, a holding plate arranged parallel to the antenna carrier plate, HF connection elements for connecting to the read or write units and a common coding connection for transmitting coding data with initial values for parameters relating to read and write processes.

7. The test head device according to claim 6, wherein the test head is arranged on the table unit in an exchangeable manner.

8. The test head device according to claim 7, wherein the parameters include values for operating frequencies, chip types and power of the UHF waves.

9. The test head device according to claim 6, wherein the parameters include positioning values for the table unit.

10. The test head device according to claims 6, wherein the coding data is transmitted to the connected read or write units and the table unit.

11. The test head device according to claim 6, wherein the table unit is moveable in the length and width direction of the strip by a sliding motion.

12. The test head device according to claim 1, wherein the second antennas include double inverted F antennas.

* * * * *